(12) United States Patent
Lu

(10) Patent No.: US 10,964,616 B2
(45) Date of Patent: Mar. 30, 2021

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/443,577

(22) Filed: Jun. 17, 2019

(65) Prior Publication Data

US 2020/0395261 A1 Dec. 17, 2020

(51) Int. Cl.
| | | |
|---|---|---|
| H01L 21/00 | (2006.01) | |
| H01L 23/31 | (2006.01) | |
| H01L 25/065 | (2006.01) | |
| H01L 23/00 | (2006.01) | |
| H01L 25/00 | (2006.01) | |
| H01L 21/78 | (2006.01) | |
| H01L 21/56 | (2006.01) | |

(52) U.S. Cl.
CPC ........ *H01L 23/3128* (2013.01); *H01L 21/568* (2013.01); *H01L 21/78* (2013.01); *H01L 23/315* (2013.01); *H01L 24/06* (2013.01); *H01L 24/13* (2013.01); *H01L 24/16* (2013.01); *H01L 25/0657* (2013.01); *H01L 25/50* (2013.01); *H01L 2224/02313* (2013.01); *H01L 2224/02331* (2013.01); *H01L 2224/02373* (2013.01); *H01L 2224/02375* (2013.01); *H01L 2224/02379* (2013.01); *H01L 2224/02381* (2013.01); *H01L 2224/06181* (2013.01); *H01L 2224/13024* (2013.01); *H01L 2224/16147* (2013.01); *H01L 2225/06513* (2013.01); *H01L 2225/06548* (2013.01); *H01L 2225/06586* (2013.01)

(58) Field of Classification Search
CPC ............ H01L 21/6835; H01L 25/0657; H01L 21/568; H01L 23/49861; H01L 24/13; H01L 21/78
See application file for complete search history.

(56) References Cited

U.S. PATENT DOCUMENTS

| | | | | |
|---|---|---|---|---|
| 7,576,436 B2* | 8/2009 | Hung | ................ | H01L 23/3107 257/778 |
| 7,626,254 B2* | 12/2009 | O | ................ | H01L 23/5389 257/686 |
| 8,143,710 B2* | 3/2012 | Cho | ................ | H01L 25/18 257/686 |
| 8,269,351 B2* | 9/2012 | Wang | ................ | H01L 23/3121 257/777 |
| 8,604,600 B2* | 12/2013 | Scanlan | ................ | H01L 24/20 257/690 |

(Continued)

*Primary Examiner* — Nicholas J Tobergte
(74) *Attorney, Agent, or Firm* — Foley & Lardner LLP

(57) ABSTRACT

A semiconductor package structure includes a first semiconductor die, an encapsulant surrounding the first semiconductor die, and a redistribution layer (RDL) electrically coupled to the first semiconductor die. The encapsulant has a first surface over the first semiconductor die and a second surface under the first semiconductor die. The RDL has a first portion under the first surface of the encapsulant and a second portion over the first surface of the encapsulant.

18 Claims, 21 Drawing Sheets

(56) References Cited

U.S. PATENT DOCUMENTS

| | | | |
|---|---|---|---|
| 9,209,131 B2* | 12/2015 | Gu | H01L 28/10 |
| 9,735,079 B2 | 8/2017 | Hu | |
| 10,109,617 B2* | 10/2018 | Lee | H01L 21/561 |
| 10,325,882 B2* | 6/2019 | Kang | H01L 25/0657 |
| 10,510,705 B2* | 12/2019 | Lu | H01L 23/3135 |
| 10,607,860 B2* | 3/2020 | Chiang | H01L 21/561 |
| 2008/0116564 A1* | 5/2008 | Yang | H01L 24/82 |
| | | | 257/698 |
| 2011/0156240 A1* | 6/2011 | Luan | H01L 24/19 |
| | | | 257/692 |
| 2012/0170240 A1* | 7/2012 | Tanaka | H01L 24/83 |
| | | | 361/783 |
| 2013/0095609 A1* | 4/2013 | Theuss | H01L 24/97 |
| | | | 438/107 |
| 2014/0008809 A1* | 1/2014 | Scanlan | H01L 21/78 |
| | | | 257/773 |

* cited by examiner

SEMICONDUCTOR PACKAGE STRUCTURE AND METHOD OF MANUFACTURING THE SAME

BACKGROUND

1. Technical Field

The present disclosure relates to a semiconductor package structure having an encapsulant with a cavity. In particular, a semiconductor die is disposed in the cavity.

2. Description of the Related Art

As miniaturization of semiconductor device packages progress, the density of internal wires in a semiconductor device package increases (or the pitch of the internal wires is reduced). However, warpage issue occurs due to different coefficients of thermal expansion (CTE) of different dielectric layers.

The warpage issue may adversely affect a subsequent operation; for example, a bent substrate (caused by warpage) may result in reliability issue when or subsequent to attaching the semiconductor device to the substrate.

SUMMARY

In some embodiments, according to one aspect of the present disclosure, a semiconductor package structure includes a first semiconductor die, an encapsulant surrounding the first semiconductor die, and a redistribution layer (RDL) electrically coupled to the first semiconductor die. The encapsulant has a first surface over the first semiconductor die and a second surface under the first semiconductor die. The RDL has a first portion under the first surface of the encapsulant and a second portion over the first surface of the encapsulant.

In some embodiments, according to one aspect of the present disclosure, a semiconductor package structure includes an encapsulant having a cavity, a first semiconductor die in the cavity, and an interconnect structure electrically coupled to the first semiconductor die. The cavity is connected to a top surface of the encapsulant. The interconnect structure includes patterned conductive layers and dielectric layers surrounding the patterned conductive layers. The top surface of the encapsulant is higher than an active surface of the first semiconductor die.

In some embodiments, according to another aspect of the present disclosure, a method is disclosed for manufacturing a semiconductor device package. The method includes: providing a first semiconductor wafer with an active surface; forming a first redistribution layer (RDL) over the active surface; forming a sacrificial layer having a first thickness over the first RDL; and encapsulating the first RDL and the sacrificial layer by a molding compound.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
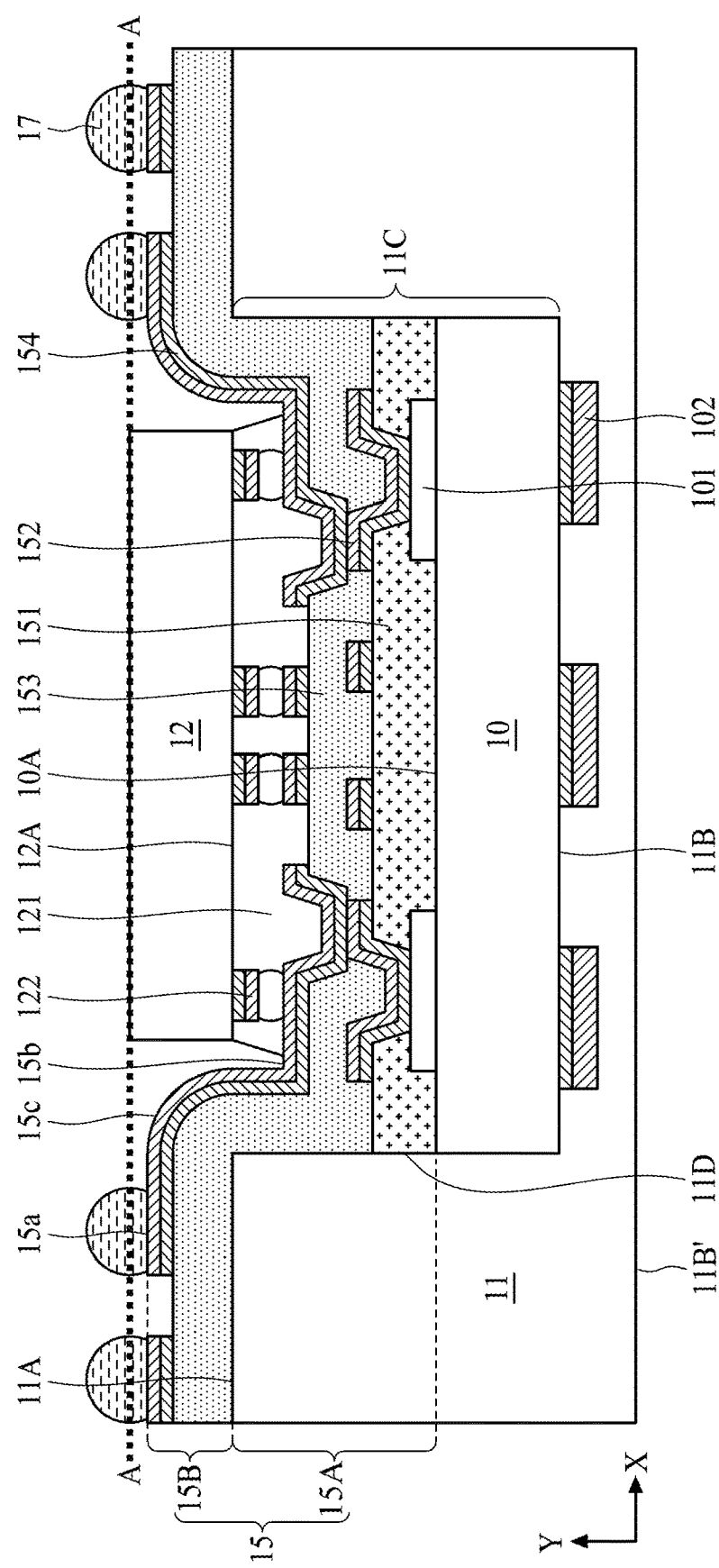
FIG. 1A illustrates a cross-sectional view of a semiconductor package structure according to some embodiments of the present disclosure.

Common reference numerals are used throughout the drawings and the detailed description to indicate the same or similar components.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Warpage is prone to occur in a comparative fan-out package structure due to CTE mismatch. Warpage may further induce delamination or conductive wire and via distortion because the stress generated by CTE mismatch is concentrated at interfaces between different materials. In addition, complex manufacturing operations such as micro-grinding hinders the applicability of a fan-out package structure. The present disclosure provides a fan-out package structure having a micro conductive line structure non-coplanar with a surface of molding compound. The fan-out package structure is fabricated under wafer-level operations until a reconfiguration step.

FIG. 1A is a cross-sectional view of a semiconductor package structure 1 in accordance with some embodiments of the present disclosure. The semiconductor package structure 1 includes a semiconductor die 10, an encapsulant 11, a semiconductor die 12, an interconnect structure 15, and a solder ball 17. The semiconductor package structure 1 may effectively eliminate stress existing in an interface between the encapsulant 11 and the interconnect structure 15.

The encapsulant 11 has a cavity 11C. The cavity 11C is defined by a bottom surface 11B and a lateral surface 11D of the encapsulant 11. The cavity 11C is connected to a top surface 11A of the encapsulant 11. The cavity 11C defined by the encapsulant 11 may reduce the stress existing in an interface between the encapsulant 11 and the interconnect structure 15. A depth of the cavity 11C may be adjusted. The encapsulant 11 may be used as a carrier. The encapsulant 11 may be further disposed on a printed circuit board (PCB). The semiconductor package structure 1 may be electrically connected to the PCB.

The semiconductor die 10 is disposed in the cavity 11C. The semiconductor die 10 is partially encapsulated by the encapsulant 11. Sidewalls of the semiconductor die 10 are encapsulated by the encapsulant 11. Accordingly, the stress, for example, caused by CTE mismatch between the encapsulant 11 and the interconnect structure 15, along Y-axis would discontinue at upper corners of the encapsulant 11 where the lateral surface 11D being in conjunction to the top surface 11A. The arrangement of the semiconductor die 10 may effectively balance the stress of the semiconductor package structure 1. The arrangement of the semiconductor die 10 may be used for eliminating warpage issue of the semiconductor package structure 1. Furthermore, the arrangement of the semiconductor die 10 may be used for heat dissipation. In some embodiments, the semiconductor die 10 may include an application-specific integrated circuit (ASIC), a controller, a processor or other electronic component or semiconductor device. The semiconductor die 10 may include a MEMS device. The semiconductor die 10 may include a memory device. The semiconductor package structure 1 may include a multi-chip structure. In some embodiments, the semiconductor package structure 1 may include two or more semiconductor dies 10.

The semiconductor die 10 includes a conductive pad 101 and a conductive pad 102. The conductive pad 101 is disposed on an active surface 10A of the semiconductor die 10. The conductive pad 101 of the semiconductor die 10 faces the interconnect structure 15. The conductive pad 101 of the semiconductor die 10 is electrically connected or coupled to the interconnect structure 15. The conductive pad 102 is disposed on a backside of the semiconductor die 10. The conductive pad 102 faces the encapsulant 11. The conductive pad 102 is encapsulated by the encapsulant 11. The conductive pad 102 may be opposite to the conductive pad 101. In some embodiments, the conductive pad 102 may be a thin metal pad. The semiconductor die 10 is in the cavity 11C. A size, an arrangement, and/or a number of the conductive pad 102 may be adjusted so as to eliminate the warpage issue of the semiconductor package structure 1. In some embodiments, the conductive pad 102 may be replaced with a conductive layer (with or without a seed layer). The conductive pad 102 may be omitted. In some embodiments, conductive pad 102 may be omitted and an adhesive layer is disposed on the backside and side walls of the semiconductor die 10.

The semiconductor die 10 is surrounded by the encapsulant 11. The active surface 10A of the semiconductor die 10 is exposed from the encapsulant 11. The top surface 11A of the encapsulant 11 is over the semiconductor die 10. The semiconductor die 10 is disposed under the top surface 11A of the encapsulant 11. The top surface 11A of the encapsulant 11 is higher than the active surface 10A of the semiconductor die 10. The bottom surface 11B of the encapsulant 11 is under the semiconductor die 10. The active surface 10A of the semiconductor die 10 is between the top surface 11A and the bottom surface 11B of the encapsulant 11.

In some embodiments, although not illustrated in FIG. 1A, the semiconductor die 10 may include a through silicon via (TSV) connecting the active surface 10A of the semiconductor die 10 and the bottom surface 11B of the encapsulant 11, and further electrically connected to a through compound via (TCV) in the encapsulant 11. One terminal of the TCV connected with the TSV, and another terminal of the TCV may be exposed at a bottom 11B' of the encapsulant 11 as an electrical terminal to be electrically connected to the PCB.

The interconnect structure 15 is disposed on the encapsulant 11. The interconnect structure 15 is disposed on the semiconductor die 10. The interconnect structure 15 covers the semiconductor die 10. The interconnect structure 15 covers the encapsulant 11. The interconnect structure 15 has a first portion 15A under the top surface 11A of the encapsulant 11 and a second portion 15B over the top surface 11A of the encapsulant 11. The first portion 15A is in the cavity 10C. The second portion 15B is out of the cavity 10C. In some embodiments, the interconnect structure 15 may be a redistribution layer (RDL). The interconnect structure 15 may include a fan-out structure. The RDL may include a conductive layer. The RDL may include a conductive layer and a dielectric layer. The interconnect structure 15 includes a plurality of patterned conductive layers 152, 154. The interconnect structure 15 includes a plurality of dielectric layers 151, 153 surrounding the patterned conductive layers 152, 154. The patterned conductive layers 152, 154 may include a copper layer and a seed layer. The patterned conductive layer 152 may be a cup-shape via or a solid-shape pillar. The dielectric layers 151, 153 may include organic materials or inorganic materials. The organic materials may be Bismaleimide-triazine (BT), Ajinomoto Build-up Film (ABF), Polyimide (PI), epoxy using photosensitive, non-photosensitive liquid, or dry-film. The inorganic materials may be oxidation materials (e.g. SiOx, SiNx, TaOx), glass, silicon, or ceramic.

The first portion 15A includes the dielectric layers 151, 153. The dielectric layer 153 stacked on the dielectric layer 151. The first portion 15A includes the patterned conductive layers 152, 154. The patterned conductive layer 154 is patterned over the patterned conductive layers 152. The second portion 15B includes the dielectric layer 153. The second portion 15B includes the patterned conductive layer 154.

The interconnect structure 15 has a top surface including an upper level 15a, a lower level 15b, and a middle level 15c. The top surface of the interconnect structure 15 is non-coplanar with the top surface 11A of the encapsulant 11. The top surface of the interconnect structure 15 has the upper level 15a over the top surface 11A of the encapsulant 11, the lower level 15b under the top surface 11A of the encapsulant 11, and the middle level 15c connecting the upper level 15a and the lower level 15b. The middle level 15c has a curved shape. The lower level 15b of the top surface of the interconnect structure 15 is laterally not aligned with the top surface 11A of the encapsulant 11, for example, the lower level 15b laterally lower than the top surface 11A of the encapsulant 11.

The semiconductor die 12 is disposed on the interconnect structure 15. The semiconductor die 12 is disposed on the lower level 15b of the top surface of the interconnect structure 15. The semiconductor die 12 is electrically connected to the semiconductor die 10 through the interconnect structure 15. The semiconductor die 12 is projected over the cavity 11C. An active surface 12A of the semiconductor die 12 can be substantially leveled with the top surface 11A of the encapsulant 11. The active surface 12A of the semiconductor die 12 faces the active surface 10A of the semiconductor die 10. In some embodiments, the active surface 12A of the semiconductor die 12 may be higher than the top surface 11A of the encapsulant 11. The semiconductor die 12 may be disposed over the cavity 11C.

The semiconductor die 12 includes an underfill 121 and a conductive pad 122. The conductive pad 122 may be electrically coupled with the patterned conductive layer 154 through a solder bump. In some embodiments, the type of the semiconductor die 12 may be the same as that of the semiconductor die 10. The type of the semiconductor die 12 may be different from that of the semiconductor die 10.

An organic compound may be used for further encapsulating a sidewall and a back surface of the semiconductor die 12. The back surface is opposite to the active surface 12A of the semiconductor die 12. Although not illustrated in FIG. 1A, in some embodiments, an additional RDL may be disposed on the organic compound encapsulating the semiconductor die 12. In some embodiments, the semiconductor die 10 is solely embedded in the cavity 11C and the semiconductor die 12 may be replaced with one or more micro-bumps. In some embodiments, the semiconductor die 10 is solely embedded in the cavity 11C and the semiconductor die 12 may be omitted.

The solder ball 17 is disposed on the patterned conductive layer 154. The solder ball 17 may be replaced with BGA, C4, LGA, or a bump structure. A height of the semiconductor die 12 may not exceed the solder ball 17.

Figure 1B:
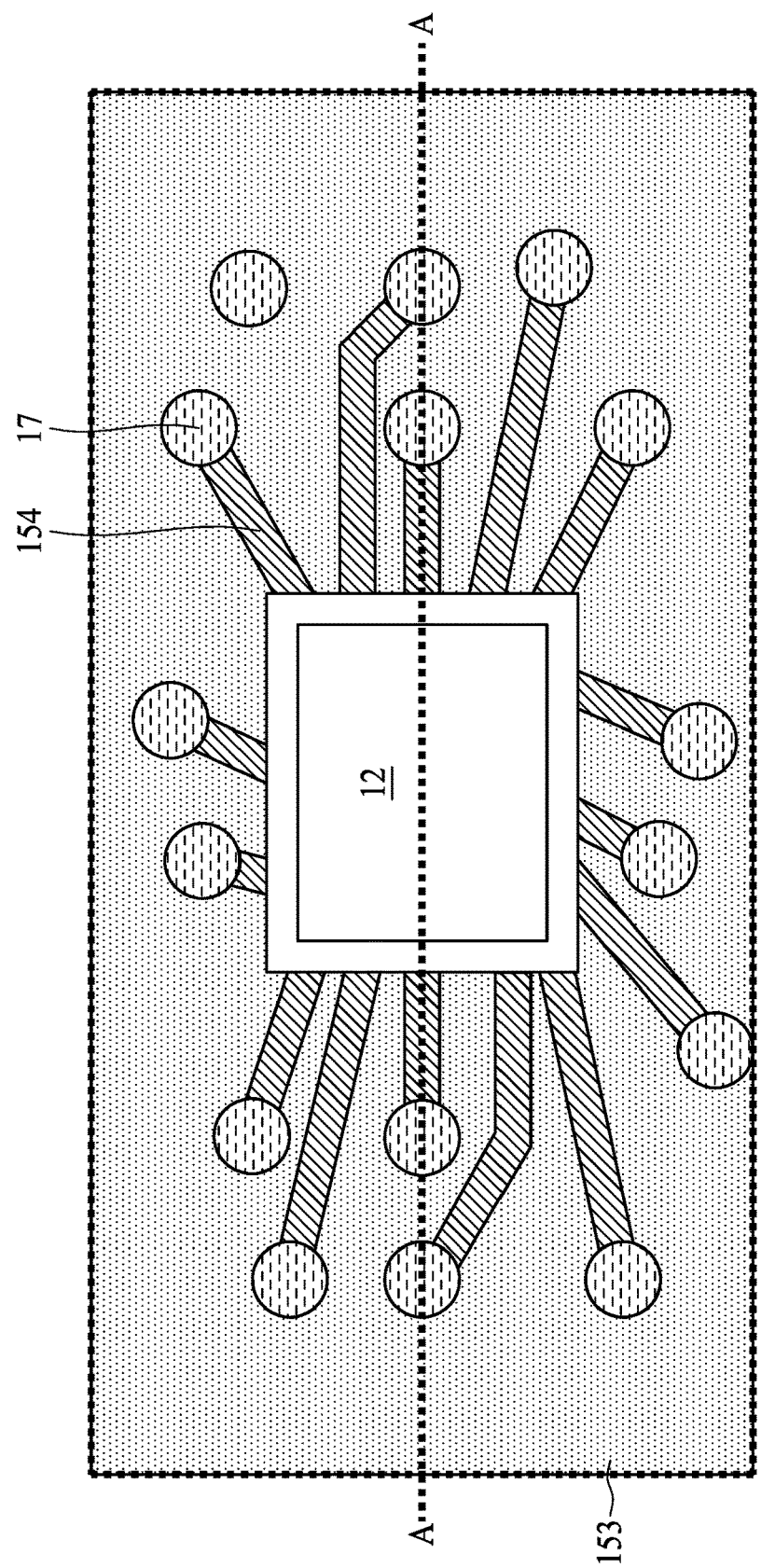
FIG. 1B illustrates a top view of a semiconductor package structure according to some embodiments of the present disclosure.

FIG. 1B is a top view of the semiconductor package structure 1 in accordance with some embodiments of the present disclosure. FIG. 1B shows that the interconnect structure 15 includes a fan-out structure.

Figure 2:
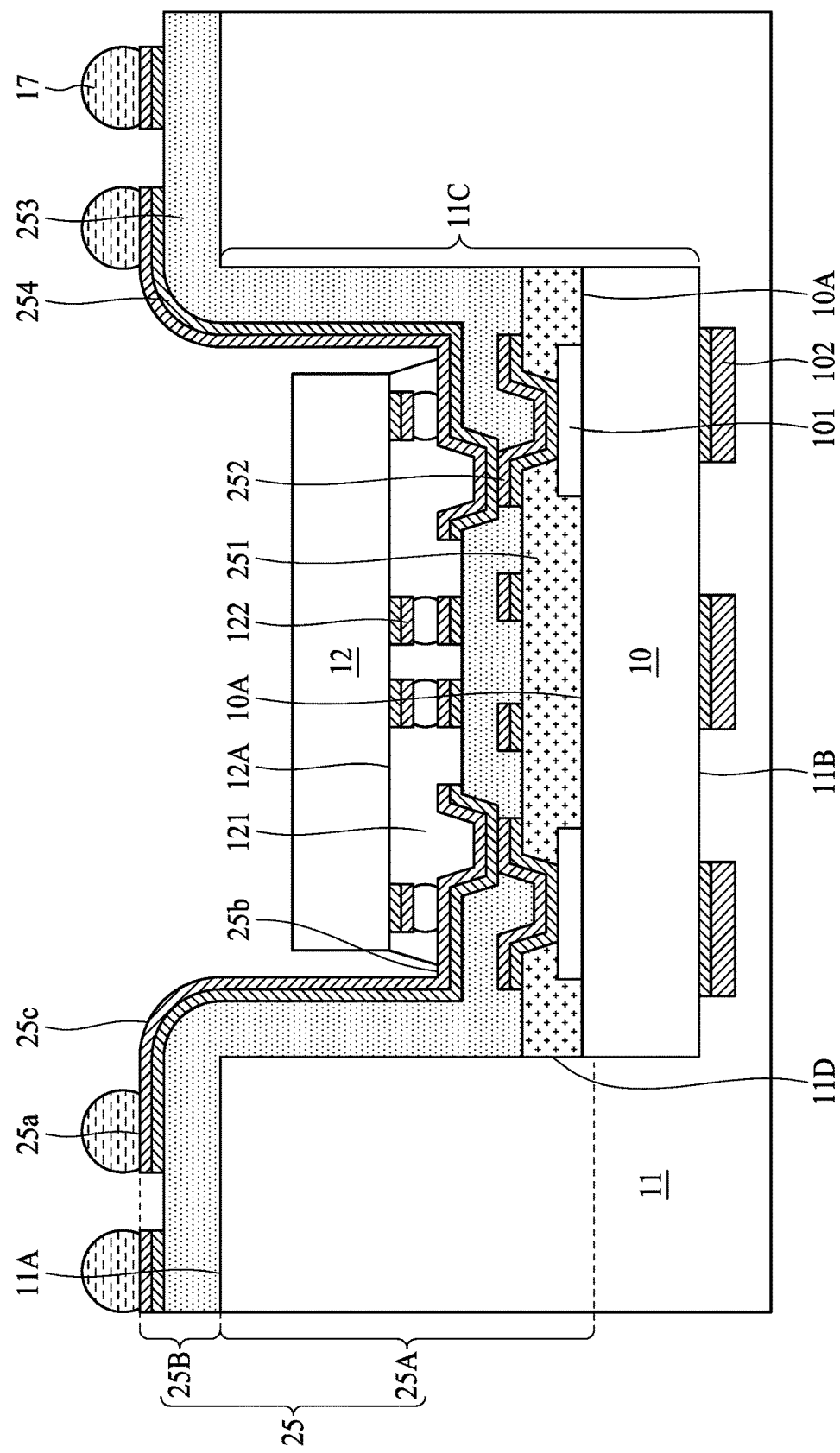
FIG. 2 illustrates a cross-sectional view of a semiconductor package structure according to some embodiments of the present disclosure.

FIG. 2 is a cross-sectional view of a semiconductor package structure 2 in accordance with some embodiments of the present disclosure. The semiconductor package structure 2 is similar to the semiconductor package structure 1 in FIG. 1A except that the semiconductor die 12 is disposed in the cavity 11C. The back surface 12B of the semiconductor die 12 is lower than the top surface 11A of the encapsulant 11. The active surface 12A of the semiconductor die 12 is further lower than the top surface 11A of the encapsulant 11.

The configuration of an interconnect structure 25 is similar to the interconnect structure 15. The interconnect structure 25 is disposed on the encapsulant 11. The interconnect structure 25 is disposed on the semiconductor die 10. The interconnect structure 25 covers the semiconductor die 10. The interconnect structure 25 covers the encapsulant 11. The interconnect structure 25 has a first portion 25A under the top surface 11A of the encapsulant 11 and a second portion 25B over the top surface 11A of the encapsulant 11. The first portion 25A is in the cavity 10C. The second portion 25B is out of the cavity 10C. In some embodiments, the interconnect structure 25 may be a redistribution layer (RDL). The interconnect structure 25 may include a fan-out structure. The RDL may include a conductive layer. The RDL may include a conductive layer and a dielectric layer. The interconnect structure 25 includes a plurality of patterned conductive layers 252, 254. The interconnect structure 25 includes a plurality of dielectric layers 251, 253 surrounding the patterned conductive layers 252, 254. The patterned conductive layers 252, 254 may include a copper layer and a seed layer. The patterned conductive layer 252 may be a cup-shape via or a solid-shape pillar. The dielectric layers 251, 253 may include organic materials or inorganic materials. The organic materials may be Bismaleimide-triazine (BT), Ajinomoto Build-up Film (ABF), Polyimide (PI), epoxy using photosensitive, non-photosensitive liquid, or dry-film. The inorganic materials may be oxidation materials (e.g. SiOx, SiNx, TaOx), glass, silicon, or ceramic.

The first portion 25A includes the dielectric layers 251, 253. The dielectric layer 253 stacked on the dielectric layer 251. The first portion 25A includes the patterned conductive layers 252, 254. The patterned conductive layer 254 is patterned over the patterned conductive layers 252. The second portion 25B includes the dielectric layer 253. The second portion 25B includes the patterned conductive layer 254.

The interconnect structure 25 has a top surface including an upper level 25a, a lower level 25b, and a middle level 25c. The top surface of the interconnect structure 25 is non-coplanar with the top surface 11A of the encapsulant 11. The top surface of the interconnect structure 25 has the upper level 25a over the top surface 11A of the encapsulant 11, the lower level 25b under the top surface 11A of the encapsulant 11, and the middle level 25c connecting the upper level 25a and the lower level 25b. The middle level 25c has a curved shape. The lower level 25b of the top surface of the interconnect structure 25 is laterally not aligned with the top surface 11A of the encapsulant 11, for example, the lower level 25b laterally lower than the top surface 11A of the encapsulant 11.

Figure 3:
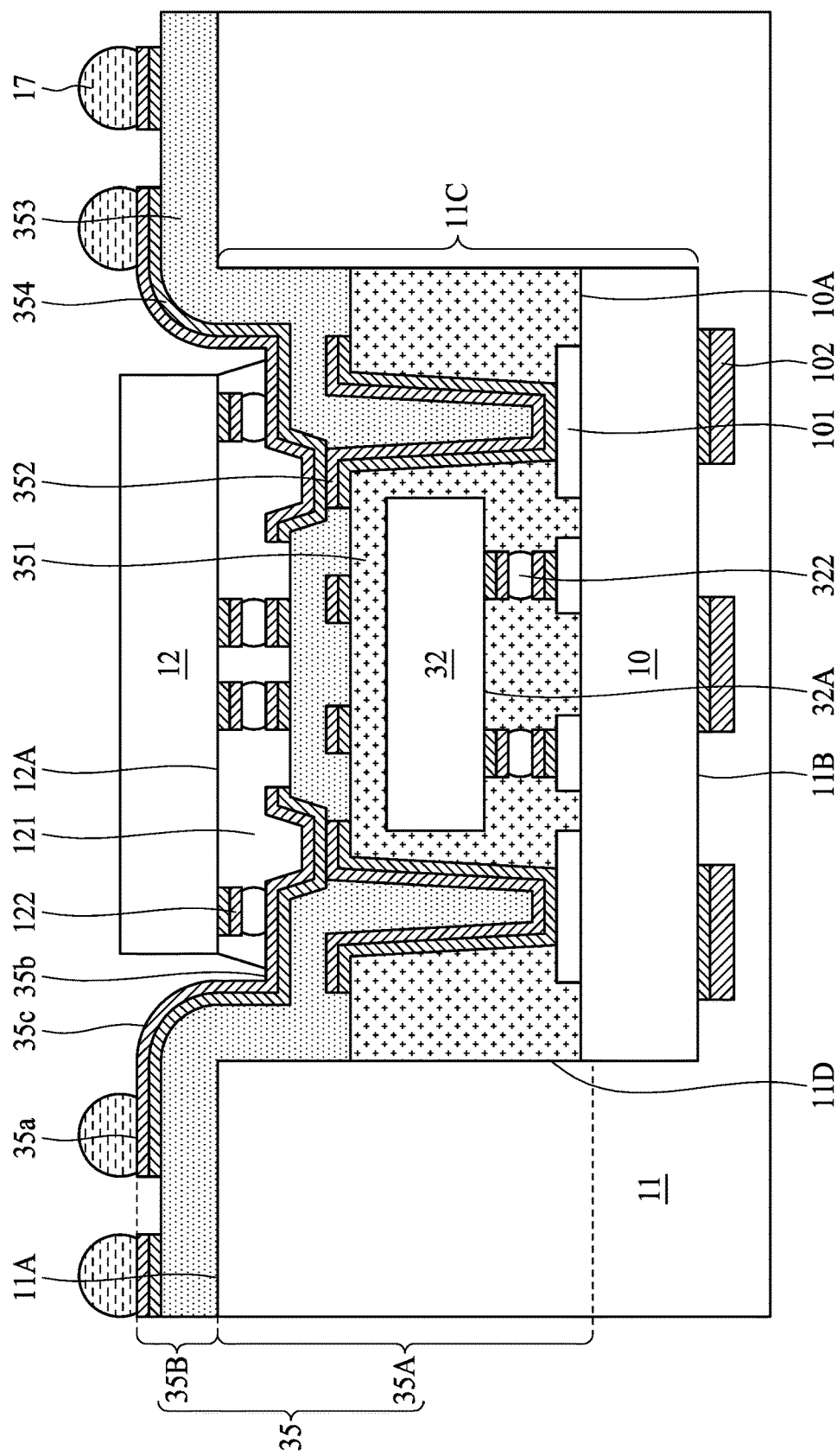
FIG. 3 illustrates a cross-sectional view of a semiconductor package structure according to some embodiments of the present disclosure.

FIG. 3 is a cross-sectional view of a semiconductor package structure 3 in accordance with some embodiments of the present disclosure. The semiconductor package structure 3 is similar to the semiconductor package structure 1 in FIG. 1A except that an additional semiconductor die 32 is disposed on the semiconductor die 10 and in the cavity 11C. An active surface 32A of the semiconductor die 32 faces the active surface 10A of the semiconductor die 10. In some embodiments, the type of the semiconductor die 32 may be the same as that of the semiconductor die 10. The type of the semiconductor die 32 may be different from that of the semiconductor die 10.

The configuration of an interconnect structure 35 is similar to the interconnect structure 15. The interconnect structure 35 has a first portion 35A under the top surface 11A of the encapsulant 11 and a second portion 35B over the top surface 11A of the encapsulant 11. The first portion 35A is in the cavity 10C. The second portion 35B is out of the cavity 10C. In some embodiments, the interconnect structure 35 may be a redistribution layer (RDL). The interconnect structure 25 may include a fan-out structure. The RDL may include a conductive layer. The RDL may include a conductive layer and a dielectric layer. The interconnect structure 35 includes a plurality of patterned conductive layers 352, 354. The interconnect structure 35 includes a plurality of dielectric layers 351, 353 surrounding the patterned conductive layers 352, 354. A thickness of the dielectric layer 351 is greater than that of the dielectric layer 353. The dielectric layer 351 covers the semiconductor die 32. The semiconductor die 32 is embedded in the dielectric layer 351. The patterned conductive layers 352, 354 may include a copper layer and a seed layer. The patterned conductive layer 352 may be a cup-shape via or a solid-shape pillar. The dielectric layers 351, 353 may include organic materials or inorganic materials. The organic materials may be Bismaleimide-triazine (BT), Ajinomoto Build-up Film (ABF), Polyimide (PI), epoxy using photosensitive, non-photosensitive liquid, or dry-film. The inorganic materials may be oxidation materials (e.g. SiOx, SiNx, TaOx), glass, silicon, or ceramic.

Figure 4B:
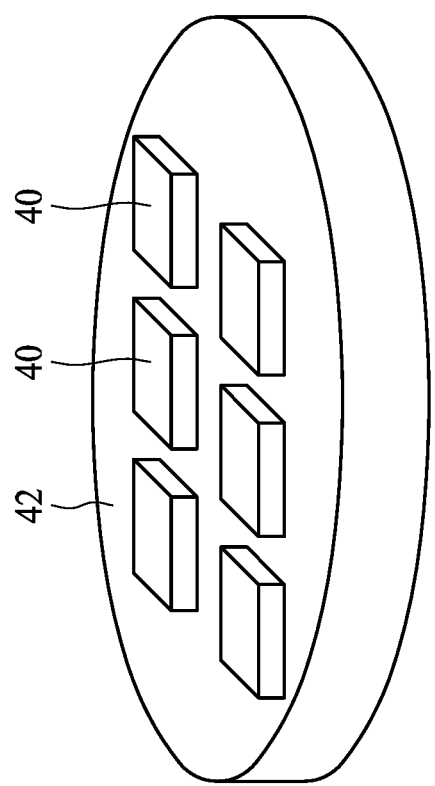
FIG. 4B illustrates a type of a carrier for semiconductor package structures in accordance with some embodiments of the present disclosure.
Figure 4A:
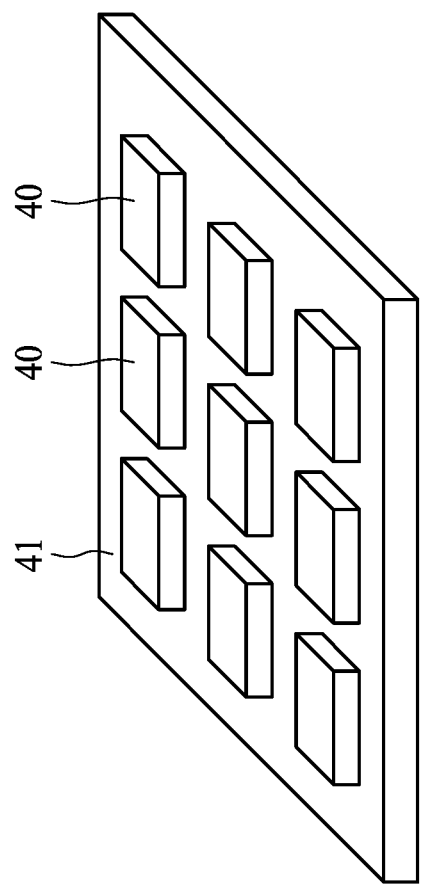
FIG. 4A illustrates a type of a carrier for semiconductor package structures in accordance with some embodiments of the present disclosure.

FIG. 4A shows a type of a carrier for semiconductor package structures in accordance with some embodiments of the present disclosure.

As shown in FIG. 4A, a plurality of semiconductor devices 40 or dies are placed on a substantially square-shaped carrier 41 (e.g. in accordance with one or more embodiments described herein). In some embodiments, the carrier 41 may include organic materials (e.g., a molding compound, BT, a PI, PBO, a solder resist, an ABF, a polypropylene (PP) or an epoxy-based material) and/or inorganic materials (e.g., silicon, glass, ceramic or quartz).

FIG. 4B shows another type of a carrier for semiconductor package structures in accordance with some embodiments of the present disclosure.

As shown in FIG. 4B, a plurality of semiconductor devices 40 or dies are placed on a substantially circle-shaped carrier 42 (e.g. in accordance with one or more embodiments described herein). In some embodiments, the carrier 42 may include organic materials (e.g., a molding compound, BT, a PI, PBO, a solder resist, an ABF, a PP or an epoxy-based material) and/or inorganic materials (e.g., silicon, glass, ceramic or quartz).

Figure 5A:
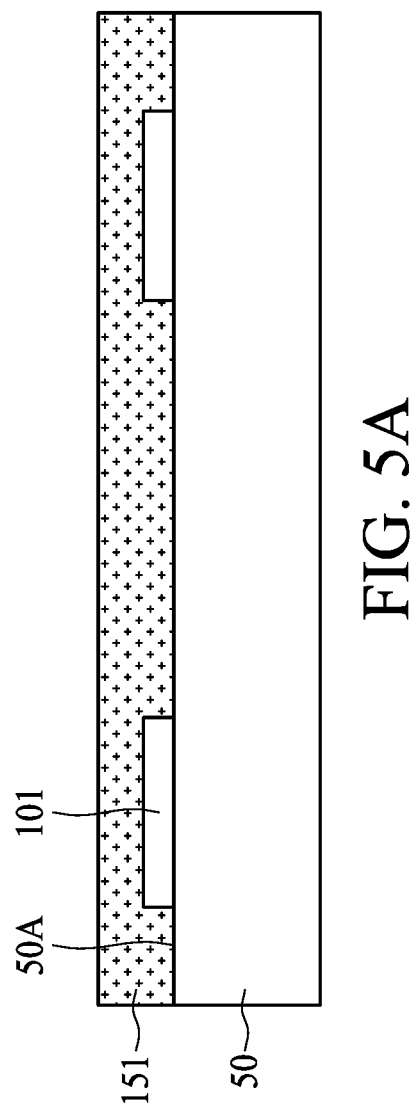
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, FIG. 5O, and FIG. 5P illustrate intermediate operations of a method for manufacturing a semiconductor package structure according to some embodiments of the present disclosure.
Figure 5B:
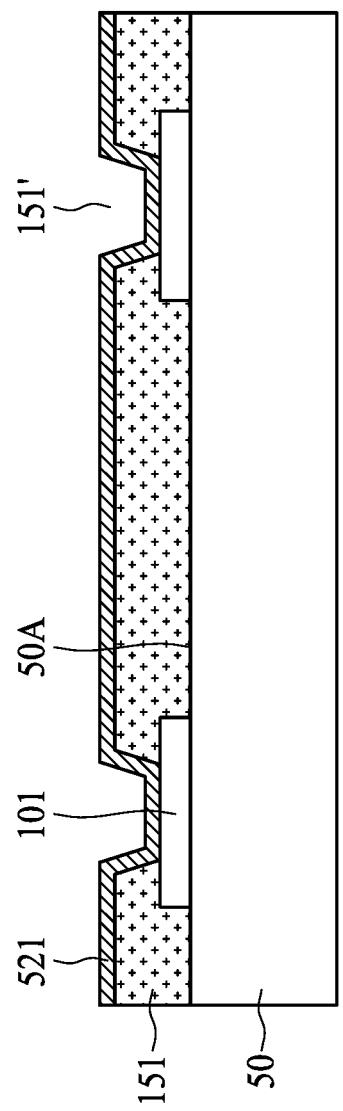
Figure 5C:
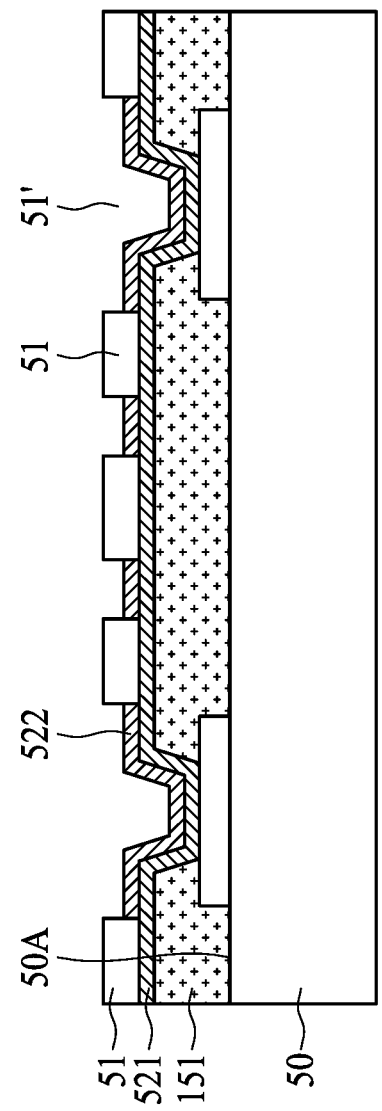
Figure 5D:
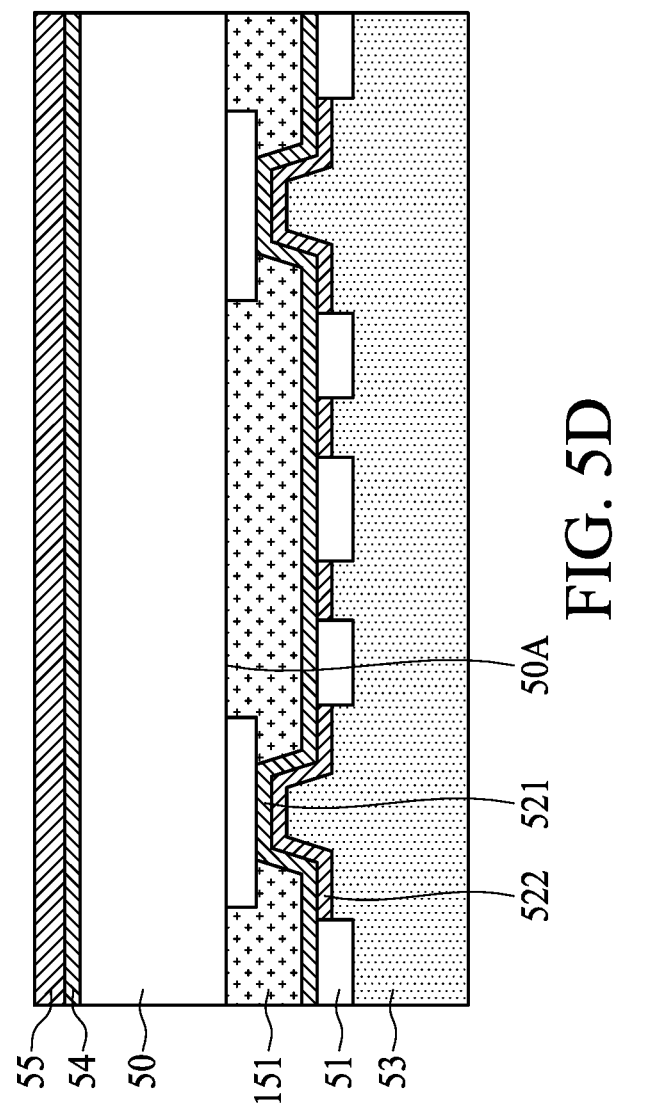
Figure 5E:
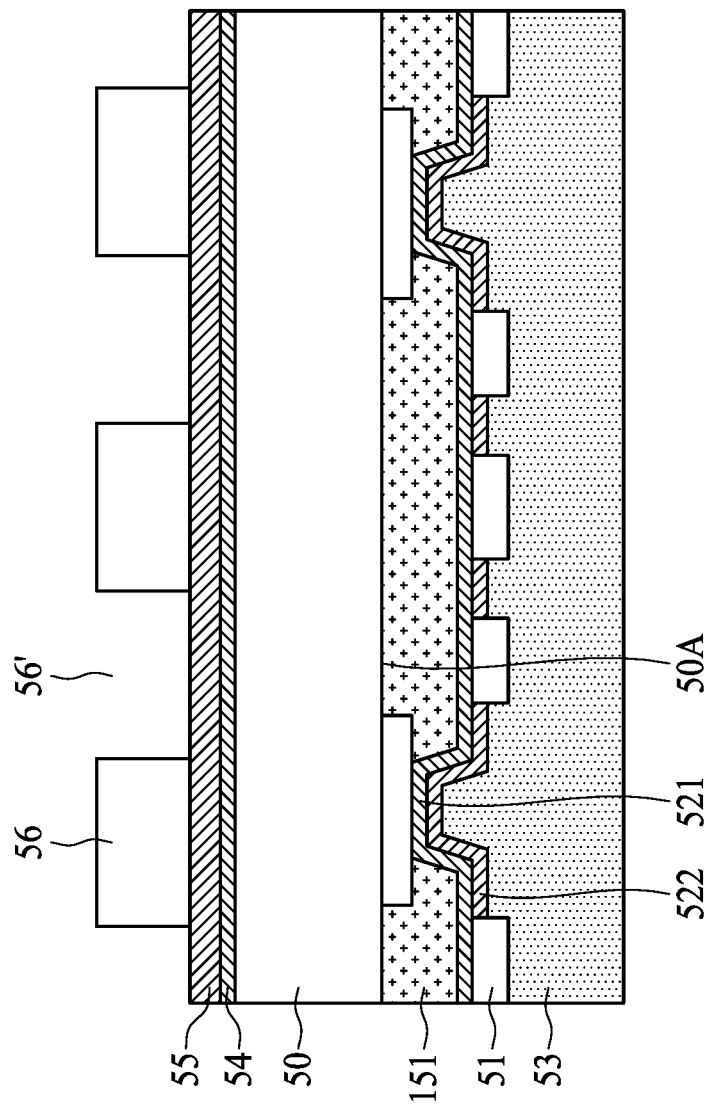
Figure 5F:
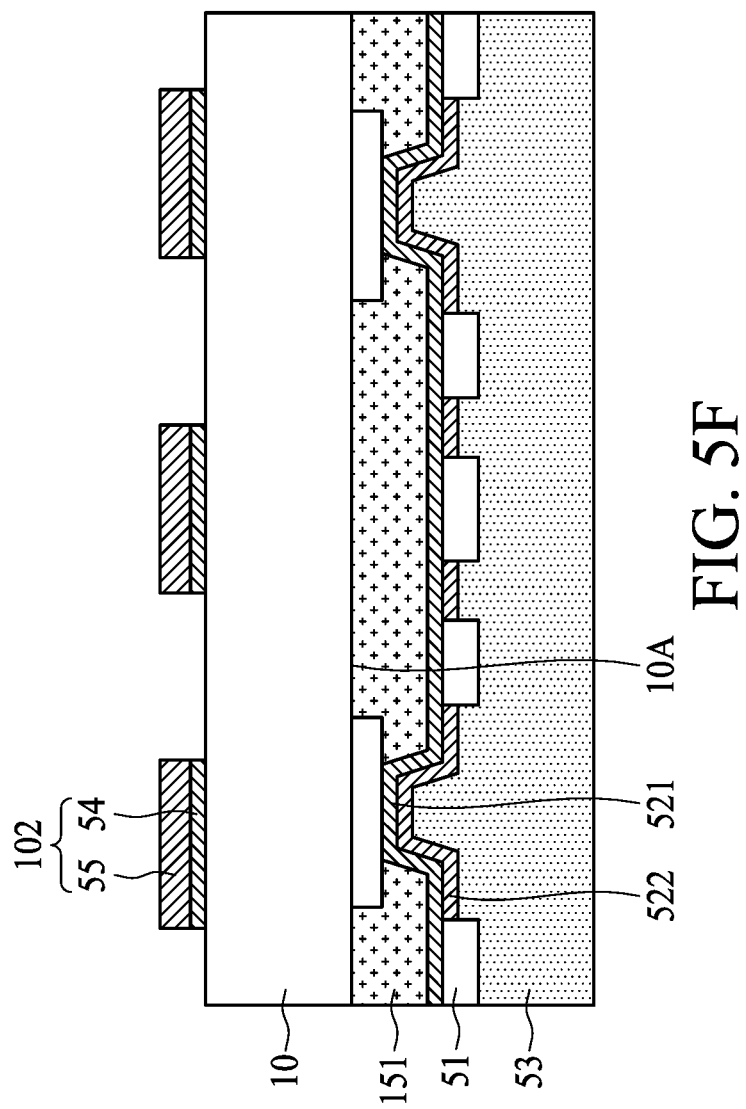
Figure 5G:
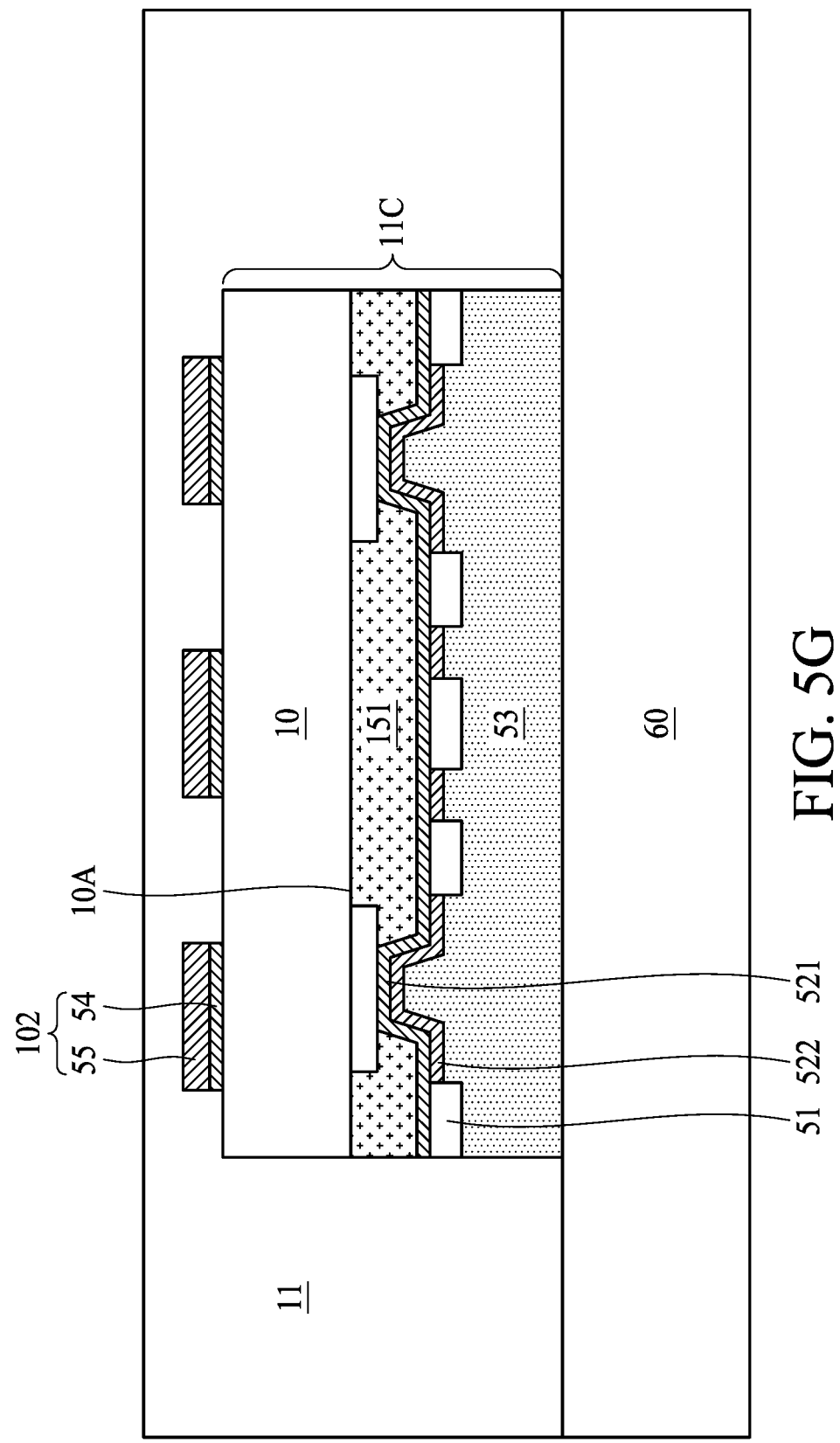
Figure 5H:
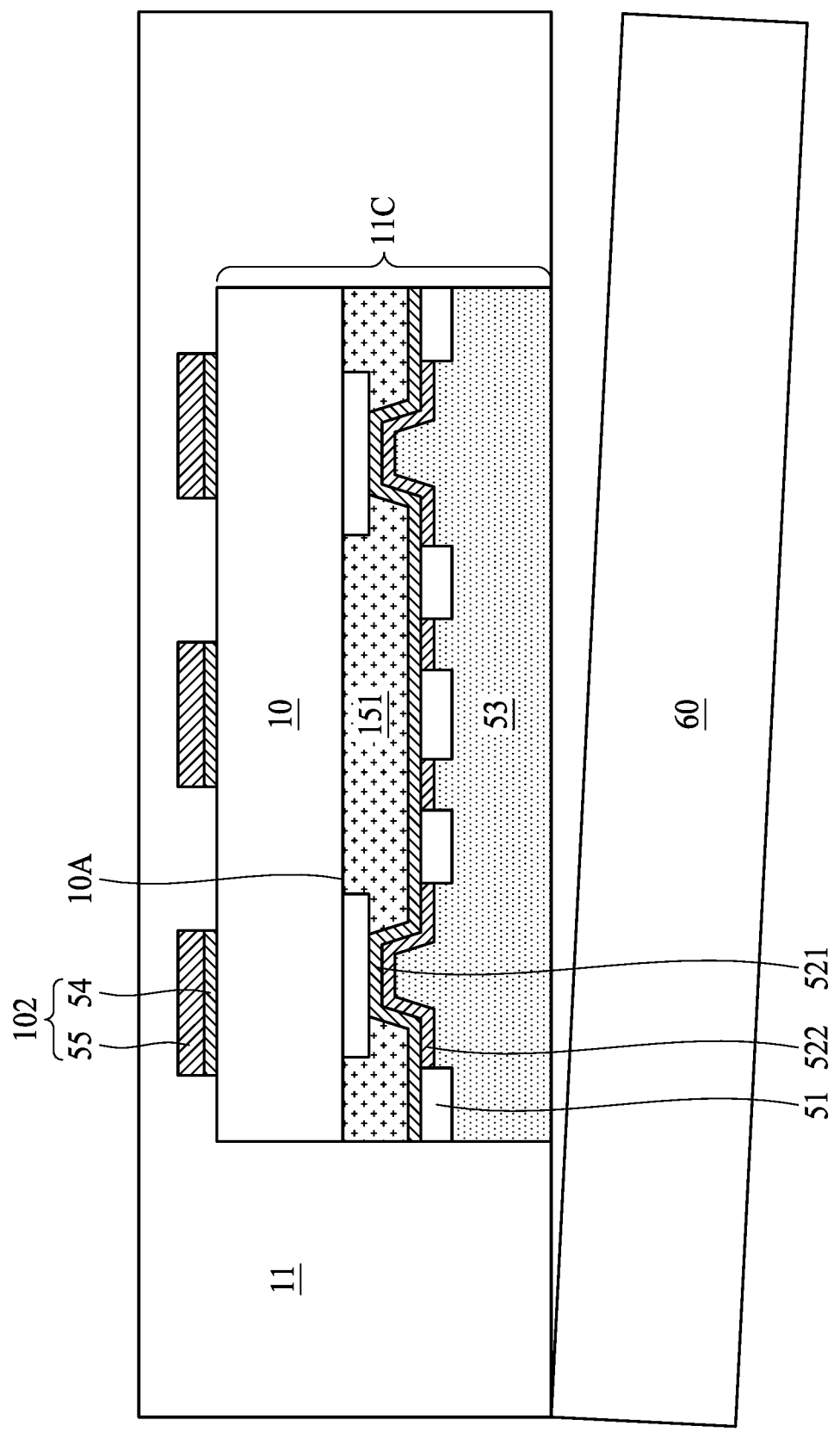
Figure 5I:
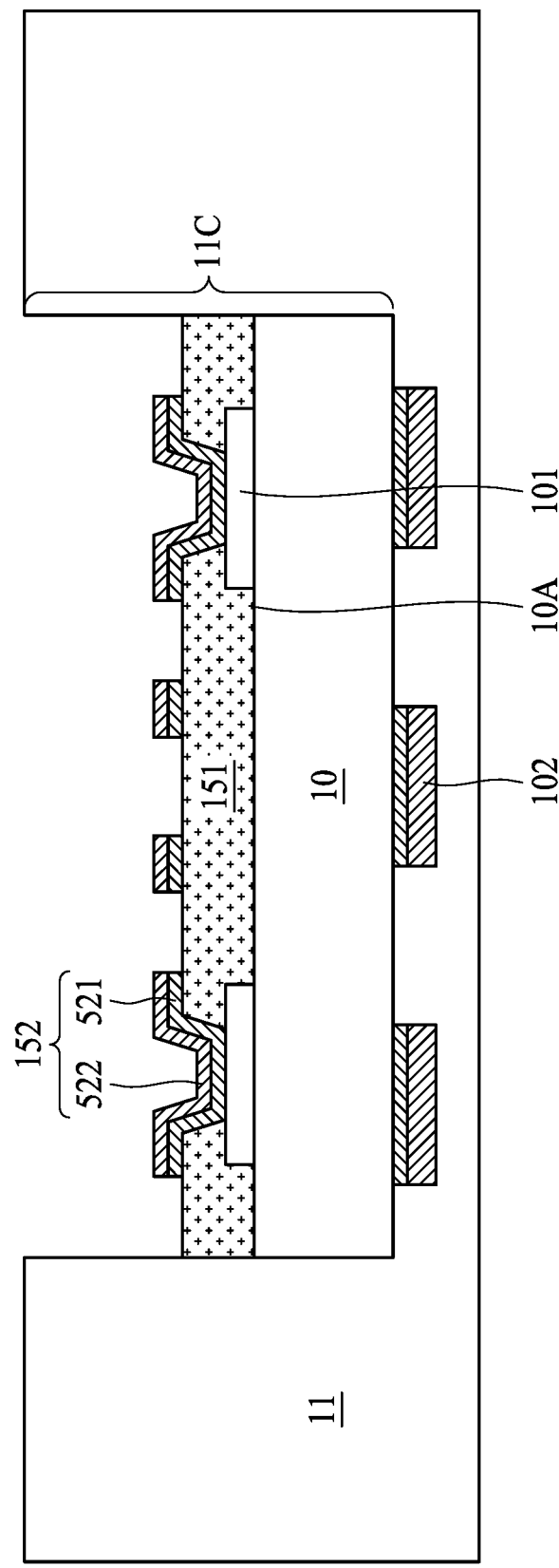
Figure 5J:
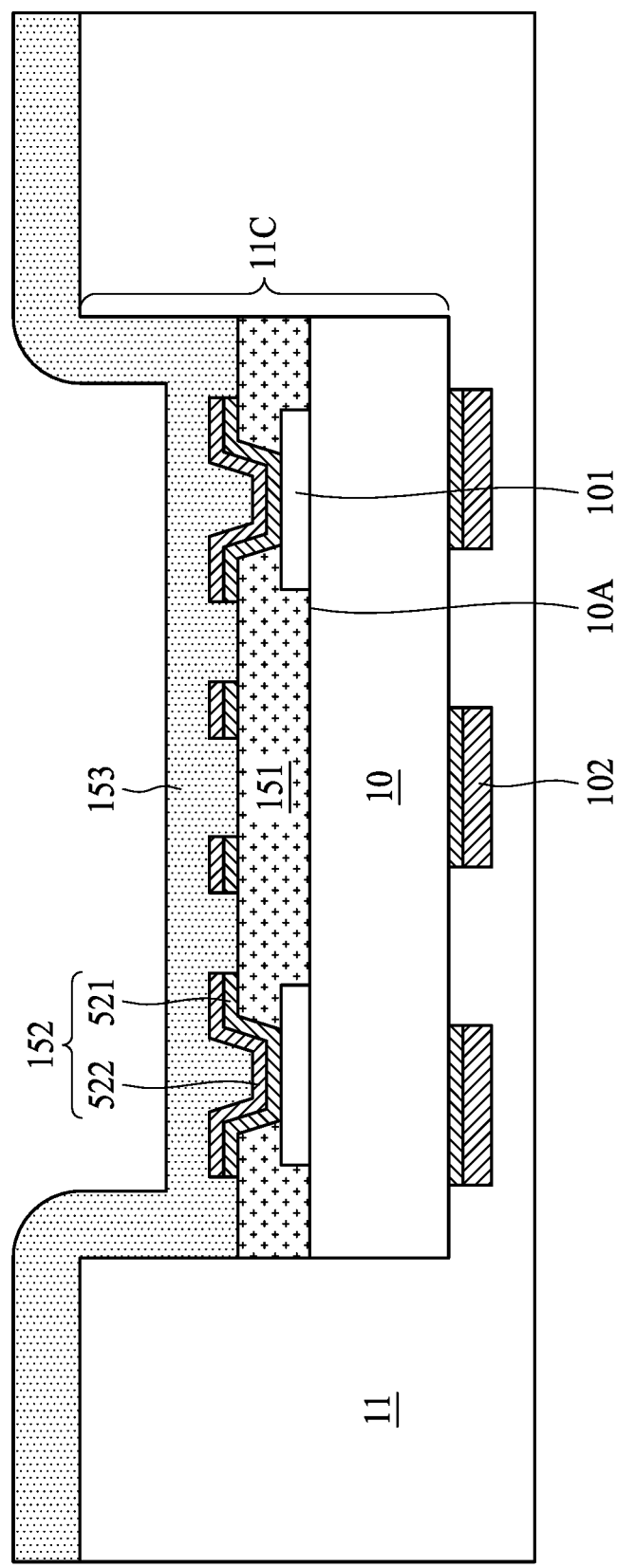
Figure 5K:
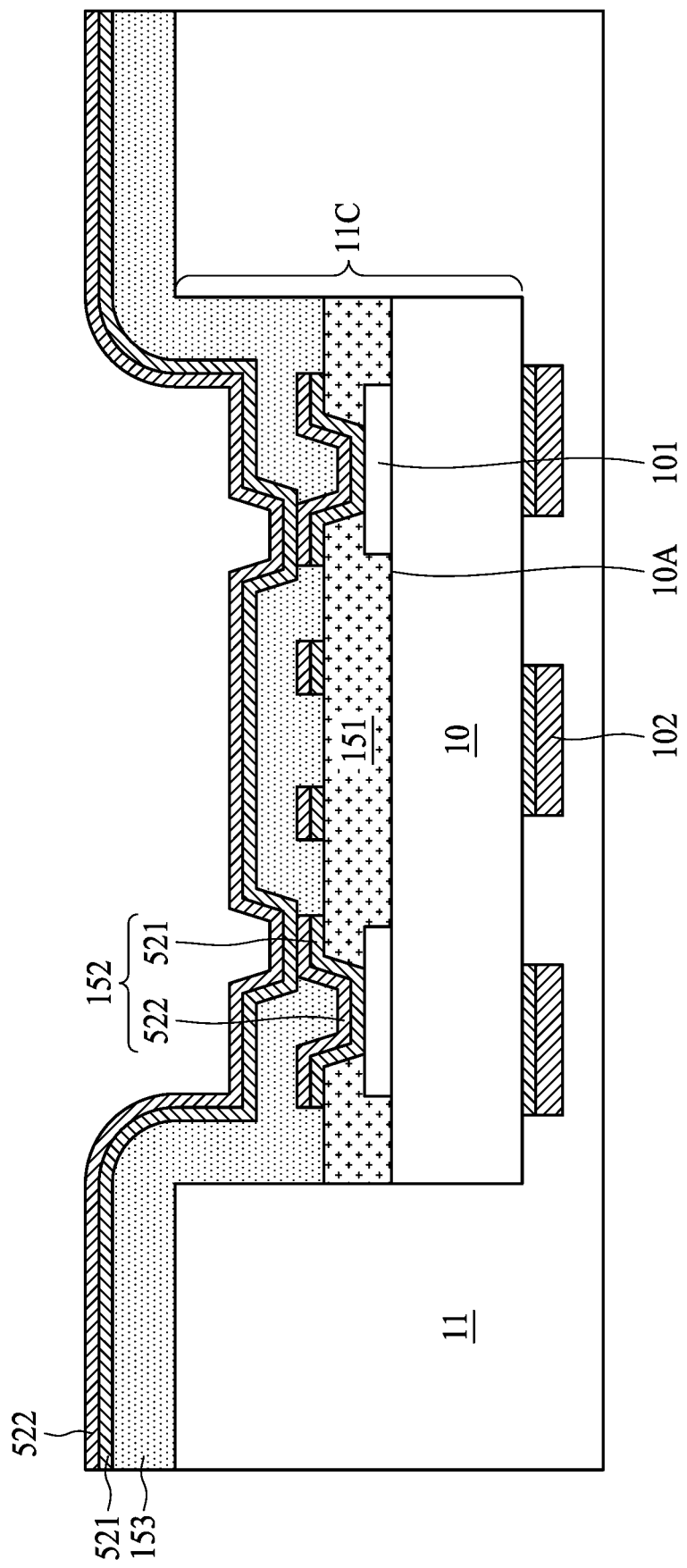
Figure 5L:
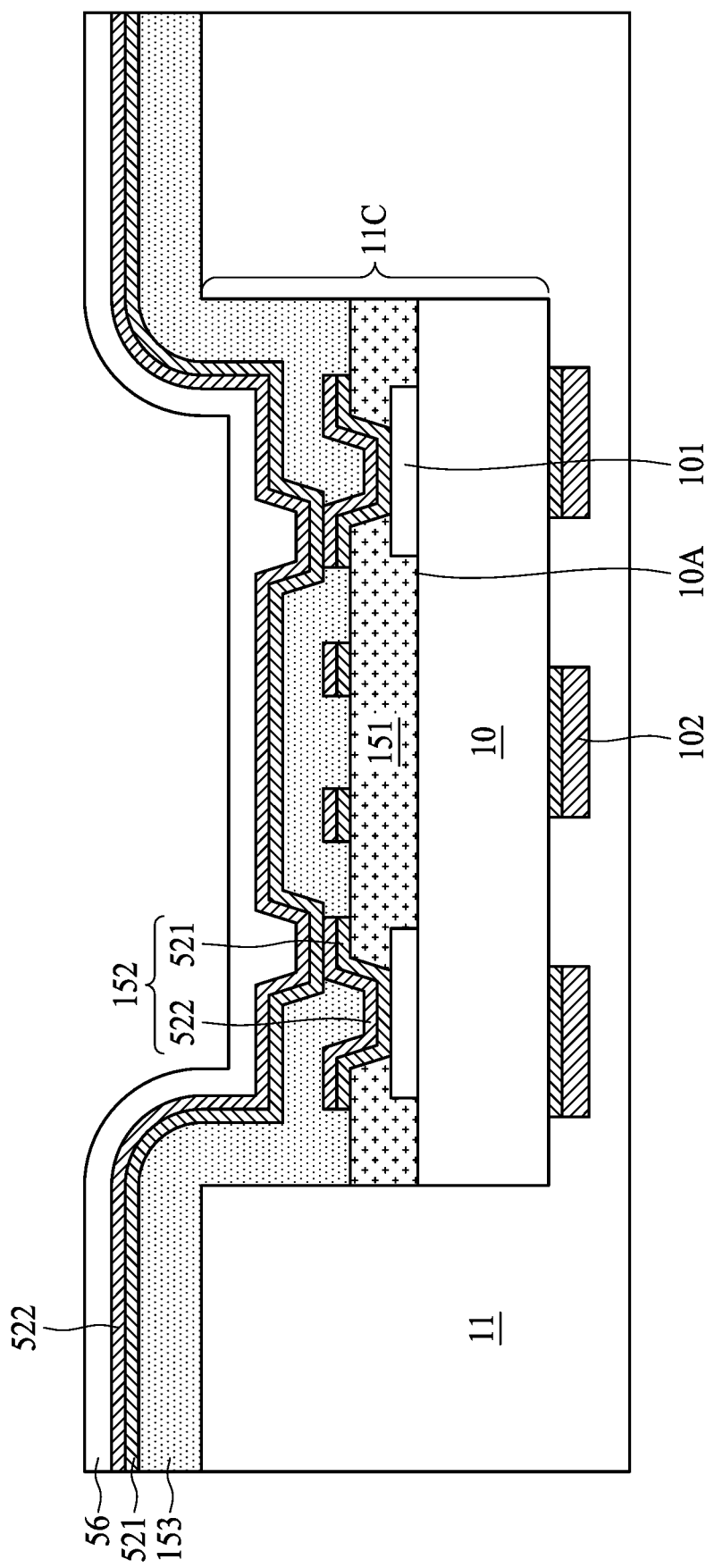
Figure 5M:
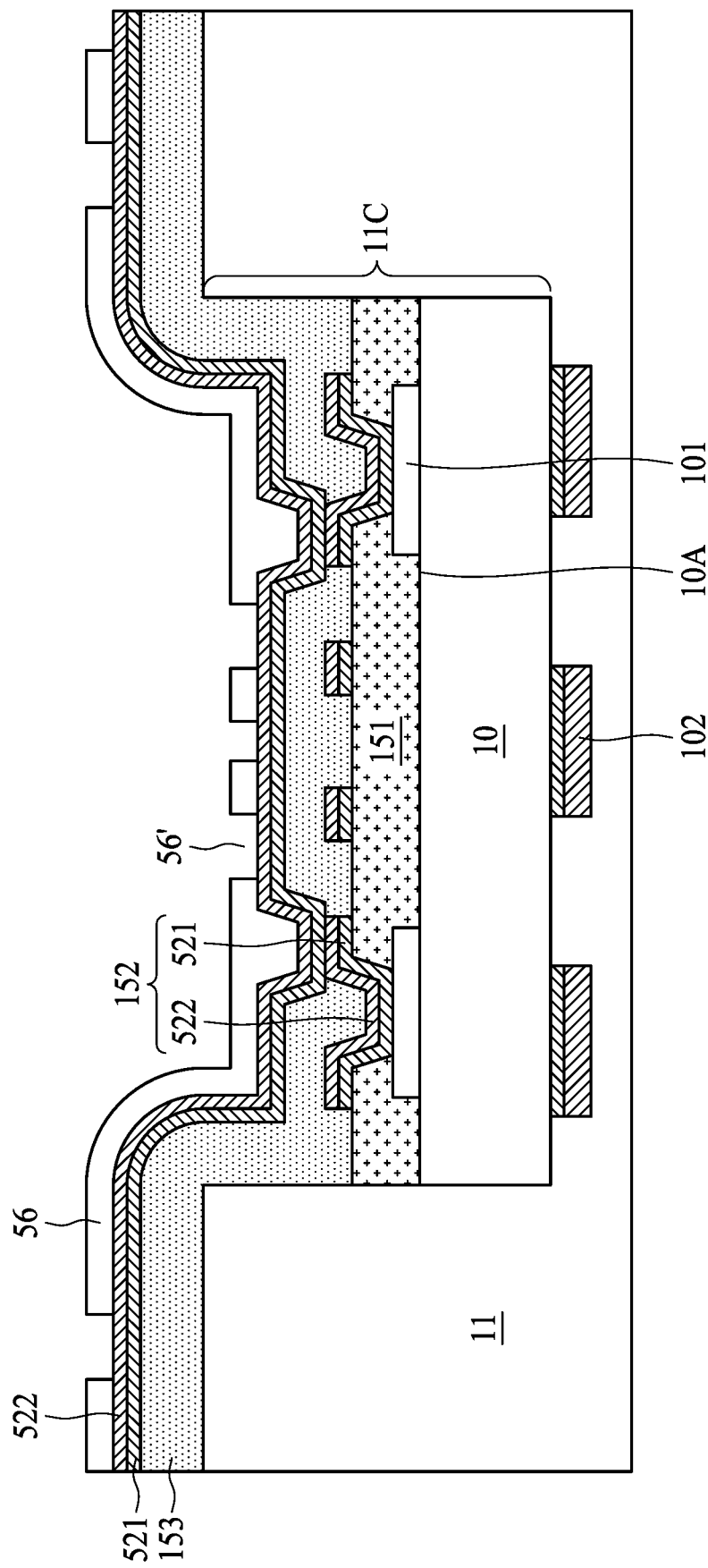
Figure 5N:
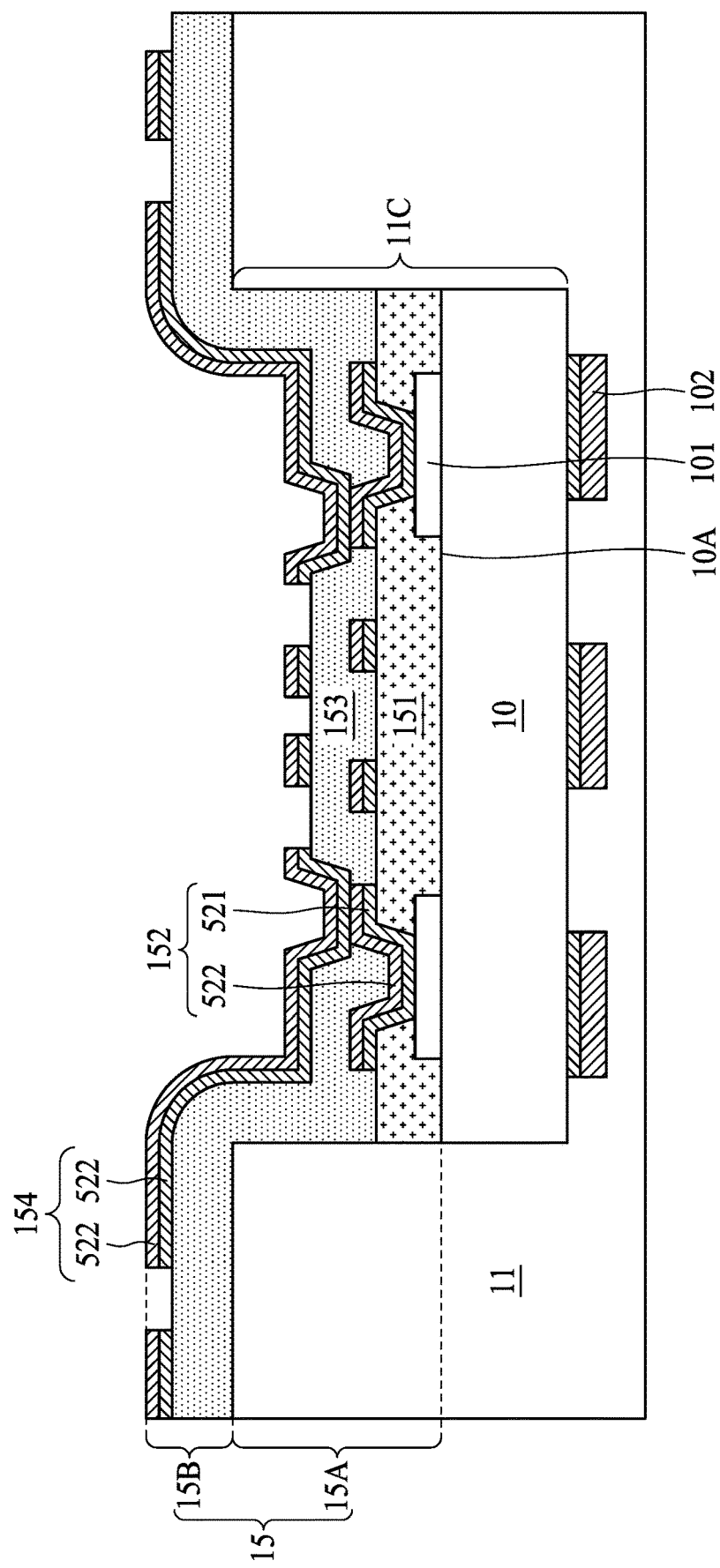
Figure 5O:
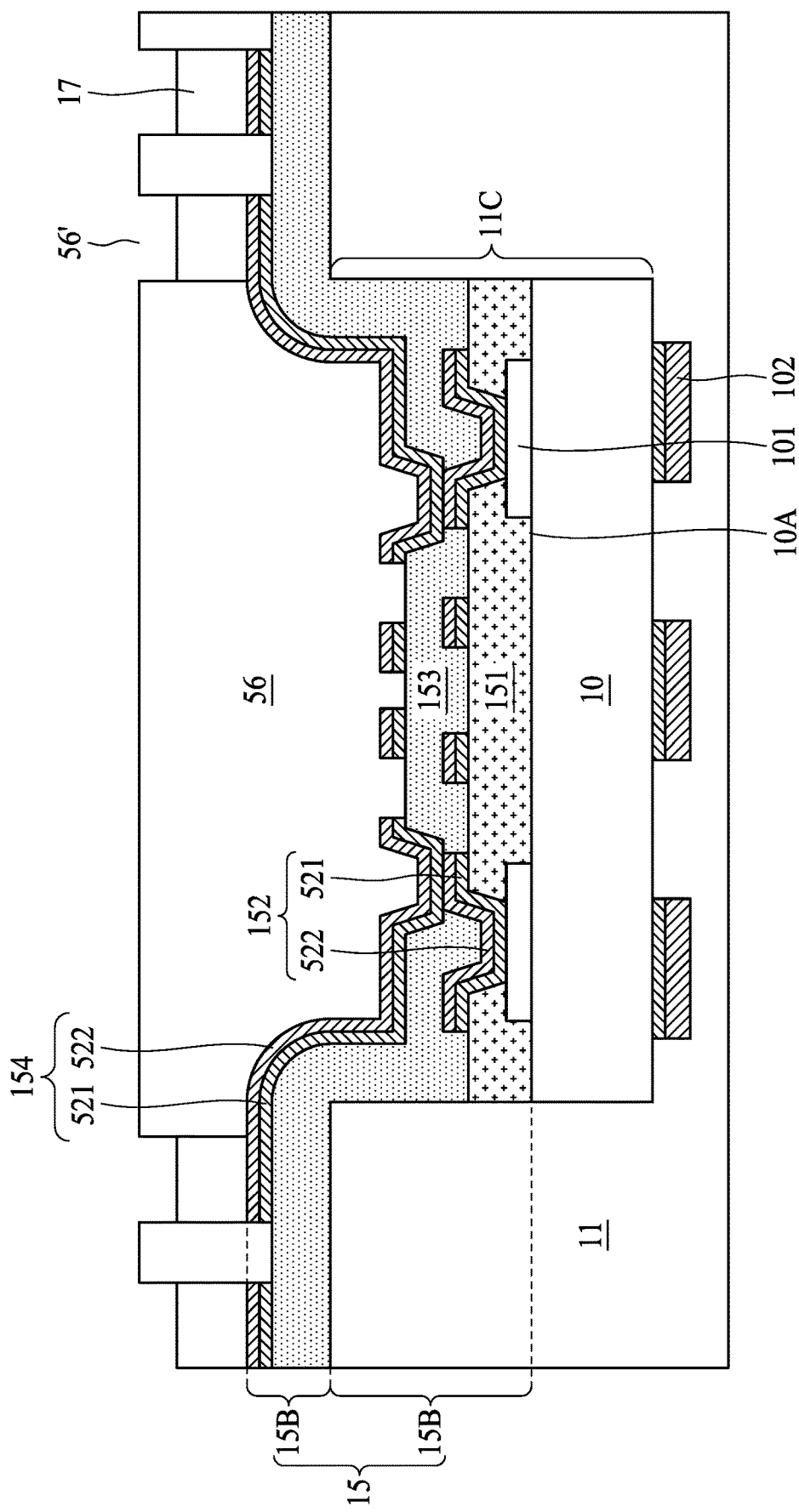
Figure 5P:
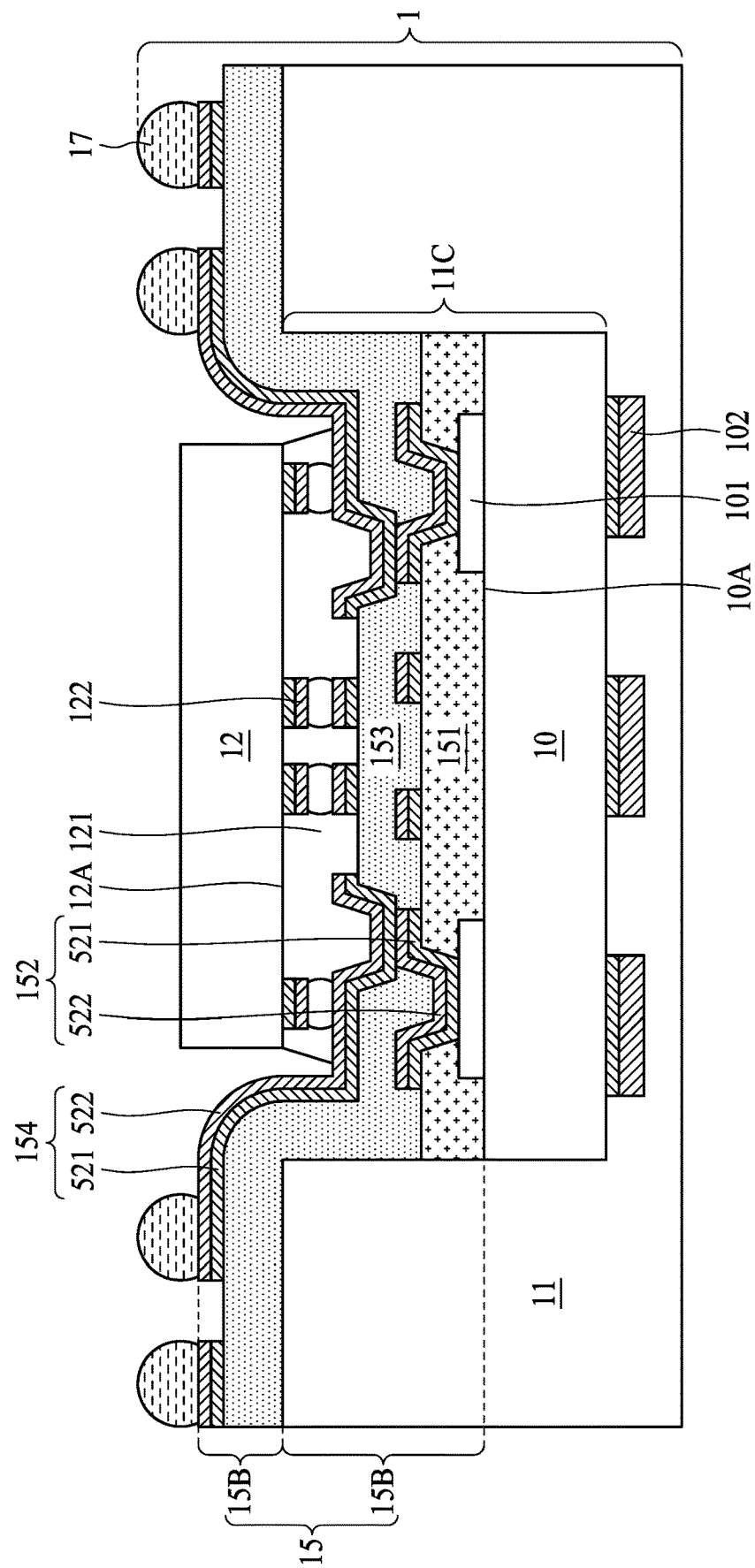

FIG. 5A through FIG. 5P illustrate some embodiments of a method of manufacturing a semiconductor package structure 1 according to some embodiments of the present disclosure. Various figures have been simplified to more clearly present aspects of the present disclosure. The semiconductor package structures 2 and 3 may be similarly manufactured.

Referring to FIG. 5A, the method for manufacturing the semiconductor package structure 1 includes providing a semiconductor wafer 50 with an active surface 50A. A conductive pad 101 is formed on the active surface 50A. A dielectric layer 151 is disposed on the semiconductor wafer 50.

Referring to FIG. 5B, the dielectric layer 151 is patterned to form an opening 151' by a lithographic operation. Subsequently, a seed layer 521 is formed on the dielectric layer 151. The seed layer 521 may include Ti/Cu, TiW or other suitable materials. The seed layer 521 may be formed by a sputter operation.

Referring to FIG. 5C, a dielectric layer 51 is disposed on the seed layer 521. The dielectric layer 51 is patterned to form an opening 51' by a lithographic operation. Subsequently, a conductive layer 522 is formed in the opening 51'. The conductive layer 522 may include Cu, Ag, Au, or other suitable materials. The conductive layer 522 may be formed by a plating operation. The dielectric layer 51, the seed layer 521, and the conductive layer 522 may be an RDL structure. The RDL structure is formed over the active surface 50A of the semiconductor wafer 50.

Referring to FIG. 5D, a dielectric layer 53 is disposed on the dielectric layer 151. The dielectric layer 53 covers the conductive layer 522 and the dielectric layer 51. The dielectric layer 53 may be a sacrificial layer. The dielectric layer 53 may be a photoresist or PI. A thickness of the dielectric layer 53 may be adjusted in consideration of desired separation between the top surface 11A and the patterned conductive layers 154, as shown in FIG. 1A. Subsequently, a seed layer 54 is formed on a backside of the semiconductor wafer 50. The seed layer 54 may include Ti/Cu, TiW or other suitable materials. The seed layer 54 may be formed by a sputter operation. A conductive layer 55 is formed on the seed layer 54. The conductive layer 54 may include Cu, Ag, Au, or other suitable materials. The conductive layer 54 may be formed by a plating operation.

Referring to FIG. 5E, a photoresist 56 is applied on the conductive layer 54. The photoresist 56 is patterned to form an opening 56'.

Referring to FIG. 5F, an etching operation is performed to form a conductive pad 102. The photoresist 56 is removed after the etching operation. Subsequently, the semiconductor wafer 50 is diced into a plurality of semiconductor dies 10 by a die singulation or a dicing operation.

Referring to FIG. 5G, the semiconductor die 10 with the RDL structure is disposed on a carrier 60. An encapsulant 11 is formed on the carrier 60 via, for example, a reconfiguration operation. The semiconductor die 10 is entirely encapsulated by the encapsulant 11. The encapsulant 11 defines a cavity 11C to accommodate the semiconductor die 10 with the RDL structure and the dielectric layer 53.

Referring to FIG. 5H, the carrier 60 is removed to expose the dielectric layer 53.

Referring to FIG. 5I, the dielectric layer 53 is removed, for example, by a chemical stripping operation. Subsequently, the patterned dielectric layer 51 is removed and exposing the underlying seed layer 521. The exposed seed layer 521 is then removed to form a conductive layer 152 by a seed etching operation.

Referring to FIG. 5J, a dielectric layer 153 is disposed on the encapsulant 11 by a lamination operation. The dielectric layer 153 is applied or formed in a vacuum system. In some embodiments, the dielectric layer 153 may include a dry film placed over the encapsulant 11 in a vacuum system. Once the semiconductor die 10, the encapsulant 11, and the dielectric layer 153 leave the vacuum system, ambient pressure would press the dielectric layer 153 such that the top surface of the dielectric layer 153 includes a curve shape at the corner of the encapsulant 11. In other embodiments, the dielectric layer 153 may include a dry film placed over the encapsulant 11 in a system providing a suction force from a frontside toward a backside of the semiconductor die 10. The dry film is then deformed to conform with the top surface of the encapsulant 11 and the top surface of the conductive layer 152.

In some embodiments, the dielectric layer 153 may include applying liquid passivation by a spin-coating operation. In this manner, the top surface of the dielectric layer 153 may or may not include a curve shape at the corner of the encapsulant 11.

Referring to FIG. 5K, the dielectric layer 153 is patterned to form an opening to partially expose the conductive layer 152. After that, the seed layer 521 is formed on the dielectric layer 153. The seed layer 521 is directly in contact with the exposed conductive layer 152. Subsequently, the conductive layer 522 is formed in the seed layer 521.

Referring to FIG. 5L, the photoresist 56 is applied on the conductive layer 522.

Referring to FIG. 5M, the photoresist 56 is patterned to form an opening 56' by a lithographic operation.

Referring to FIG. 5N, the seed layer 521 and the conductive layer 522 is partially removed to form a conductive layer 154 by an etching operation. Subsequently, the photoresist 56 is removed. An interconnect structure 15 is formed. The interconnect structure 15 has a first portion 15A under the top surface 11A of the encapsulant 11 and a second portion 15B over the top surface 11A of the encapsulant 11. The first portion 15A is in the cavity 10C. The second portion 15B is out of the cavity 10C. The interconnect structure 15 includes a RDL structure.

Referring to FIG. 5O, the photoresist 56 is applied on the interconnect structure 15. The photoresist 56 is patterned to form an opening 56' by a lithographic operation. A solder material 17 is filled in the opening 56' by a solder plating operation.

Referring to FIG. 5P, a solder ball 17 is formed by a ball formation operation (e.g. a heating operation). A semiconductor die 12 is disposed on the interconnect structure 15. The position of the semiconductor die 12 may be predesigned by adjusting a thickness of the dielectric layer 53 shown in FIG. 5D and being removed in FIG. SI due to its sacrificial nature. The semiconductor die 12 may be disposed over or in the cavity 11C. The semiconductor die 12 is projected over the cavity 11C. The active surface 12A of the semiconductor die 12 faces the active surface 10A of the semiconductor die 10.

An underfill 121 is applied to protect a conductive pad 122 of the semiconductor die 12. The conductive pad 122 is in contact with the patterned conductive layer 154. The conductive pad 122 is directly in contact with the dielectric layer 153. In some embodiments, the type of the semiconductor die 12 may be the same as that of the semiconductor die 10. The type of the semiconductor die 12 may be different from that of the semiconductor die 10.

Subsequently, a package singulation operation is performed to form the semiconductor package structure 1.

As used herein, spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
    a first semiconductor die;
    an encapsulant surrounding the first semiconductor die, the encapsulant having a first surface over the first semiconductor die and a second surface under the first semiconductor die; and
    a redistribution layer (RDL) electrically coupled to the first semiconductor die, the RDL comprising:
        a first portion under the first surface of the encapsulant; and
        a second portion over the first surface of the encapsulant,
    wherein the first semiconductor die includes a first conductive pad on a front side of the first semiconductor die facing the RDL and a second conductive pad on a back side of the first semiconductor die facing the encapsulant.

2. The semiconductor package structure of claim 1, wherein the first semiconductor die is disposed under the first surface of the encapsulant.

3. The semiconductor package structure of claim 1, wherein the RDL comprises an upper level, a top surface of the upper level being substantially non-coplanar with the first surface of the encapsulant.

4. The semiconductor package structure of claim 3, wherein the RDL comprises the upper level over the first surface, a lower level under the first surface, and a middle level connecting the upper level and the lower level.

5. The semiconductor package structure of claim 4, further comprising a second semiconductor die disposed on the lower level of the RDL.

6. The semiconductor package structure of claim 5, wherein the second semiconductor die is electrically connected to the first semiconductor die through the RDL.

7. The semiconductor package structure of claim 1, wherein the RDL includes a fan-out structure.

8. The semiconductor package structure of claim 4, wherein the first surface of the encapsulant is between the upper level and the lower level of the RDL.

9. The semiconductor package structure of claim 4, wherein the middle level of the RDL is curved.

10. A semiconductor package structure, comprising:
    an encapsulant having a cavity, the cavity being connected to a top surface of the encapsulant;
    a first semiconductor die in the cavity;
    an interconnect structure electrically coupled to the first semiconductor die, the interconnect structure comprising patterned conductive layers and dielectric layers surrounding the patterned conductive layers; and
    a second semiconductor die disposed on the interconnect structure and projected over the cavity,
    wherein the top surface of the encapsulant is higher than an active surface of the first semiconductor die.

11. The semiconductor package structure of claim 10, wherein the first semiconductor die is surrounded by the encapsulant and the active surface of the first semiconductor die is exposed from the encapsulant.

12. The semiconductor package structure of claim 10, wherein the interconnect structure is a fan-out redistribution layer (RDL).

13. The semiconductor package structure of claim 10, wherein the interconnect structure includes a first portion in the cavity and a second portion out of the cavity.

14. The semiconductor package structure of claim 10, wherein an active surface of the second semiconductor die is leveled with the top surface of the encapsulant.

15. A method of manufacturing a semiconductor package device, comprising:
    providing a first semiconductor wafer with an active surface;
    forming a first redistribution layer (RDL) over the active surface;
    forming a sacrificial layer having a first thickness over the first RDL; and
    encapsulating the first RDL and the sacrificial layer by a molding compound.

16. The method of claim 15, further comprising:
    exposing the first RDL by removing the sacrificial layer after encapsulating the first RDL and the sacrificial layer, wherein a height difference between a top surface of molding compound and the first RDL is substantially identical to the first thickness.

17. The method of claim 15, further comprising:
    dicing the first semiconductor wafer into a plurality of first semiconductor dies prior to encapsulating the first RDL and the sacrificial layer.

18. The method of claim 15, further comprising:
    forming a dielectric layer over the first RDL and the top surface of the molding compound.

* * * * *